(12) United States Patent
Tiyyagura et al.

(10) Patent No.: US 8,559,262 B2
(45) Date of Patent: Oct. 15, 2013

(54) CAPACITOR POWER SOURCE TAMPER PROTECTION AND RELIABILITY TEST

(75) Inventors: Srikanth Reddy Tiyyagura, Bangalore (IN); David Still, Colorado Springs, CO (US); Jayant Ashokkumar, Colorado Springs, CO (US); David G Wright, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 173 days.

(21) Appl. No.: 13/340,439

(22) Filed: Dec. 29, 2011

(65) Prior Publication Data

US 2013/0170312 A1    Jul. 4, 2013

(51) Int. Cl.
*G11C 5/14* (2006.01)

(52) U.S. Cl.
USPC .................. 365/229; 365/189.09; 365/226

(58) Field of Classification Search
USPC .......... 365/189.09, 189.07, 226, 229, 230.06, 365/185.22
See application file for complete search history.

(56) References Cited

U.S. PATENT DOCUMENTS

| | | | | |
|---|---|---|---|---|
| 5,581,692 A * | 12/1996 | Nevitt et al. | .................. | 714/12 |
| 5,715,464 A * | 2/1998 | Crump et al. | .................. | 713/323 |
| 6,081,752 A * | 6/2000 | Benson et al. | .................. | 700/79 |
| 8,115,179 B2 * | 2/2012 | Riedel et al. | .................. | 250/392 |
| 2007/0168681 A1 * | 7/2007 | Leung | .................. | 713/300 |
| 2011/0254514 A1 * | 10/2011 | Fleming | .................. | 320/166 |

* cited by examiner

*Primary Examiner* — Gene Auduong (57) ABSTRACT

A verification circuit for a capacitor power supply measures at least two voltages across the terminals of the capacitor at two points in time, the two points in time defining a time interval dT. A change in voltage dV over the time interval dT is determined. An operation powered by the capacitor is initiated, or not, by deriving from the time interval dT and/or the voltage change dV, a total required time or a total required voltage for completing the operation, and comparing the total required time or total required voltage to a pre-determined necessary total time or predetermined necessary total voltage, respectively (a "time interval test").

21 Claims, 13 Drawing Sheets

CAPACITOR POWER SOURCE TAMPER PROTECTION AND RELIABILITY TEST

BACKGROUND

Figure 1:
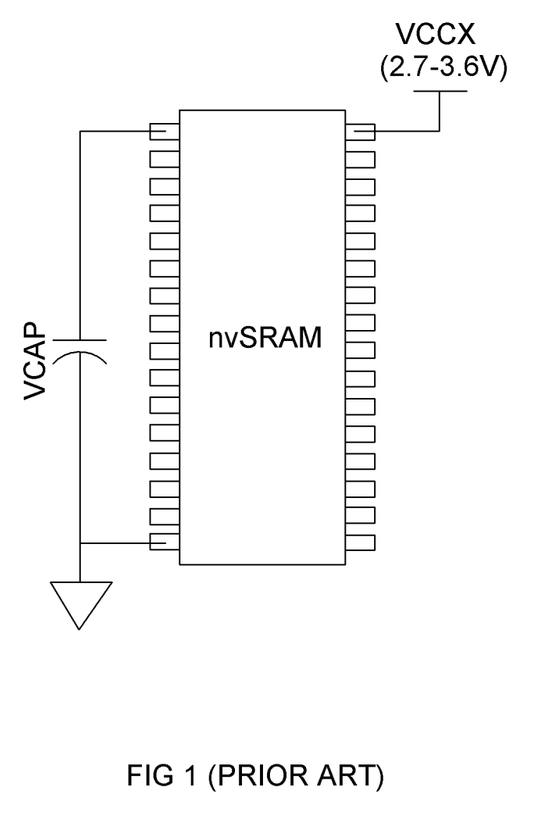
FIG. 1 illustrates a non-volatile static random access memory (nvSRAM) device with two power supplies.

FIG. 1 illustrates a non-volatile static random access memory (nvSRAM) device with two power supplies. The primary supply is referred to herein as VCCX. Typical ranges of the primary supply voltage, for nvSRAM devices, are 2.7V-3.6V. An nvSRAM comprises volatile memory cells (RAM cells) each coupled with a corresponding non-volatile memory cell (nv cell). The nvSRAM performs various operations such as reads, writes, soft stores, and soft recalls as long as VCCX is ON.

The backup power supply is referred to herein as VCAP. VCAP is provided by one or more capacitors, typically "ultracapacitors" which have high energy capacity relative to conventional capacitors. When the external supply VCCX is switched OFF, or "browns out" (falls below a threshold voltage level), the nvSRAM operates from VCAP for a period of time. VCAP is typically pre-charged to a voltage Vcap>=Vccx, where Vcap is the voltage across the terminal of the backup capacitor, and Vccx is the primary power supply voltage. Typically, the only operation powered by VCAP is the transfer of the contents of the RAM cells to the nv cells of the nvSRAM (referred to herein as an "autostore" operation). When VCCX is powered up again, the contents of the nv cells are transferred back to the RAM cells by a process referred to as RECALL. The state of the RAM cells is thus preserved even in the absence of primary power.

Figure 2:
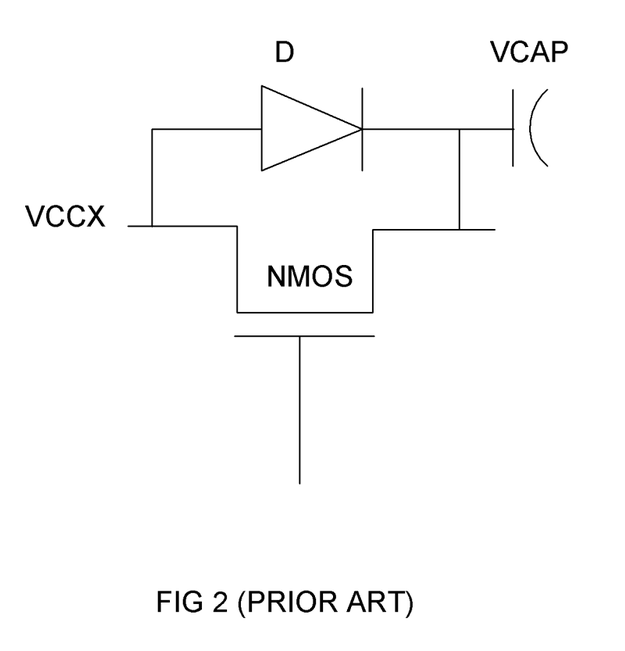
FIG. 2 illustrates an NMOS device with a diode configured between its source and drain for charging VCAP.

In one implementation, VCAP is pre-charged to Vcap>=Vccx when VCCX is turned ON. An NMOS device with a diode configured between its source and drain may be used to charge VCAP (see FIG. 2). The gate of the NMOS device is boosted to 2*Vccx, so that there is no voltage drop across the NMOS device. Once VCAP is charged to Vccx, the nvSRAM is enabled for both volatile and non-volatile memory operations.

Figure 3:
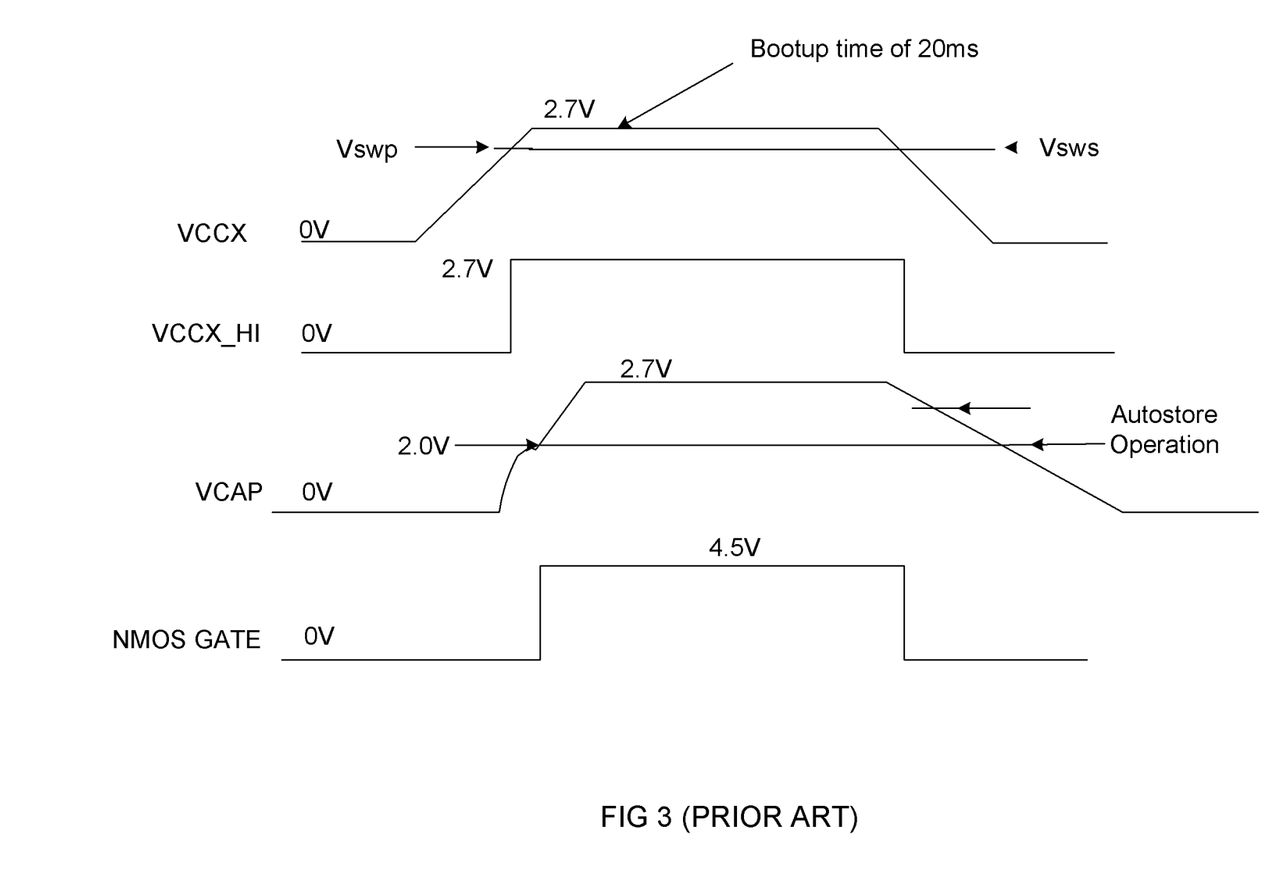
FIG. 3 illustrates an example of how VCCX and VCAP may be operated during power up and power down.

An autostore is initiated when the primary power supply VCCX becomes unavailable. FIG. 3 illustrates an example of how VCCX and VCAP may be operated during power up and power down. In this example, Vccx rises to about 2.7V. During the rise of Vccx at power-up, it passes a threshold value Vswp. Signal VCCX_HI is asserted at this point, indicating that Vccx has reached a sufficient high enough level to power a RECALL operation if so required. At Vswp, the NMOS gate which couples VCCX to VCAP turns ON. The memory device is enabled for reads and writes, for example approximately 20 ms (or after any pre-determined time delay) after power-on of VCCX.

When VCCX is switched OFF, meaning when VCCX dips below the threshold level of Vsws, VCCX_HI goes low, indicating primary power was lost. A request to do an autostore is initiated to the (internal micro-controller) memory controller. VCAP provides the energy to complete the autostore operation so that data is not lost before the memory powers down.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Preliminaries

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other.

"Logic" refers to machine memory circuits, machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic is a implementation decision that will vary according to implementation.

Overview

Described herein are logic and techniques to verify and/or ensure that sufficient power is available from a capacitor power supply for a particular device operation, for example to power an integrated circuit for a specific pre-defined time and load. The operation may be the transfer of data from volatile cells to non-volatile cells of an nvSRAM prior to a power down operation (an autostore). If VCAP is insufficiently charged when VCCX drops below Vsws, there may be insufficient stored energy in the capacitor to perform a full autostore. Data from SRAM may be lost or corrupted, hence a need to verify the power capacity of the capacitor before undertaking the autostore operation.

DESCRIPTION OF PARTICULAR EMBODIMENTS

Figure 4:
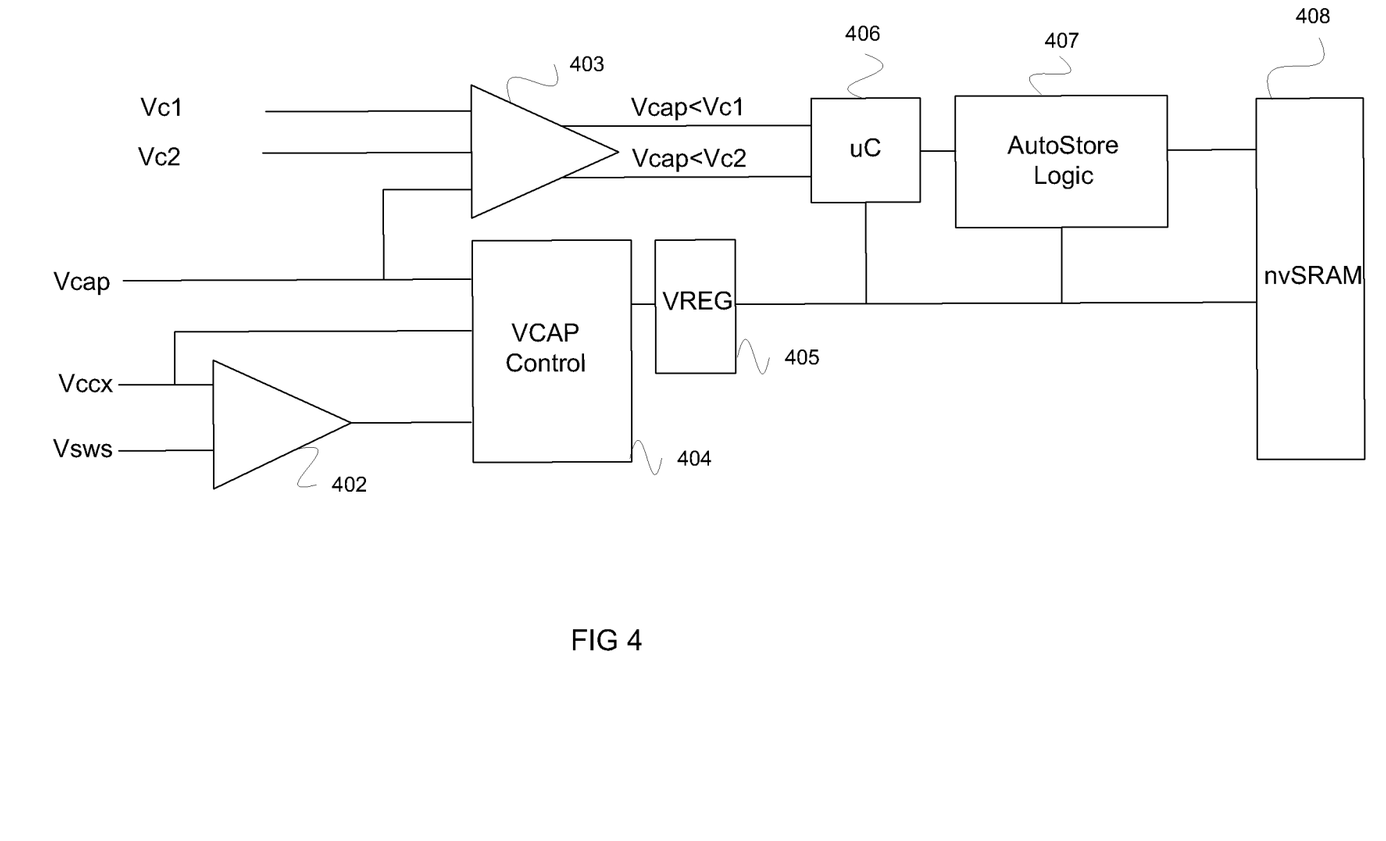
FIG. 4 illustrates a circuit and technique utilizing two comparators to verify if a capacitor can deliver sufficient energy for an operation.

One technique to verify if VCAP can deliver sufficient energy for an autostore utilizes two comparators. This technique and associated logic are shown in FIG. 4. One comparator 402 asserts a signal when Vccx falls below Vsws. The second comparator 403 asserts a first signal when Vcap falls below a first threshold Vc1, and asserts a second signal when Vcap falls below a second threshold Vc2. A measure is taken by the memory controller 406 of the time difference dT between assertion of the first signal Vc1 and the second signal Vc2 by the comparator 403. If the time difference dT is less than a predetermined interval Tas, then the Vcap decay is too rapid, indicative that VCAP will run out of power before the autostore operation can complete. In this case the autostore logic 407 is not initiated on the nvSRAM 408 by the memory controller 406. If the time difference dT is longer than the predetermined interval Tas, then the Vcap decay is sufficiently slow to complete a successful autostore without running out of VCAP energy. In this case, autostore is initiated. Thus, even though Vccx falls below Vsws, and a loss of primary power may be imminent, the autostore is not initiated if dT is less than the predetermined interval Tas. VCAP control 404 charges VCAP to VCCX. This may be done in some designs through an NMOS switch. One implementation of VCAP control 404 is a single stage charge pump which boosts the gate of the NMOS switch to 2*VCCX so that VCAP is equal to VCCX and there is no threshold drop across the NMOS switch. Voltage regulator VREG 405 utilizes the higher of VCCX or VCAP and generates an internal regulated voltage (e.g., 1.9V) which supplies other system components (e.g., microcontroller 406, logic 407, and memory 408).

Thus, two (or more) voltages across the capacitor terminals are measured using a comparator to compare an instantaneous capacitor voltage with a first input and a second input at the two points in time defining dT. In one design, the first input to the comparator is preset to the first voltage, and the second input to the capacitor is preset to the second voltage. Other designs may dynamically determine and assign the two voltage levels using, for example, the controller 406 and a digital to analog converter (DAC).

In one implementation, the measurements of Vcap and the time interval Tas between the first and second threshold voltages Vc1, Vc2 are made by switching a known load across the terminals of the capacitor after Vccx falls below Vsws, but before an autostore operation is initiated. In another implementation, the time interval measurement is performed during normal device operation, while Vccx is above Vsws. For example, the time interval measure could be taken while the capacitor is being charged on power-up of VCCX, or periodically during normal operation of the memory device, prior to initiating a power-down or brown out of VCCX.

The available time for the autostore may be calculated using a predetermined Vcap minimum starting voltage. The time interval test may be conducted after Vccx is detected to have fallen below Vsws, but before an autostore operation is initiated. Alternatively, the time interval test may be performed while Vccx is still ON (i.e., above Vsws).

Thus, a verification circuit for a capacitor power supply may include logic to measure at least two voltages across the terminals of the capacitor at two points in time, the two points in time defining a time interval dT. The verification circuit may include logic to determine a change in voltage dV over the time interval dT, the change in voltage defined by the two voltages that are measured. The verification circuit may further include logic to determine whether to initiate an operation powered by the capacitor, by extrapolating the time interval dT or the voltage change dV to a total required time or a total required voltage for completing the operation, and comparing the total required time or total required voltage to a pre-determined necessary total time or predetermined necessary total voltage, respectively, for completing the operation. These acts are collectively a "time interval test".

Figure 5:
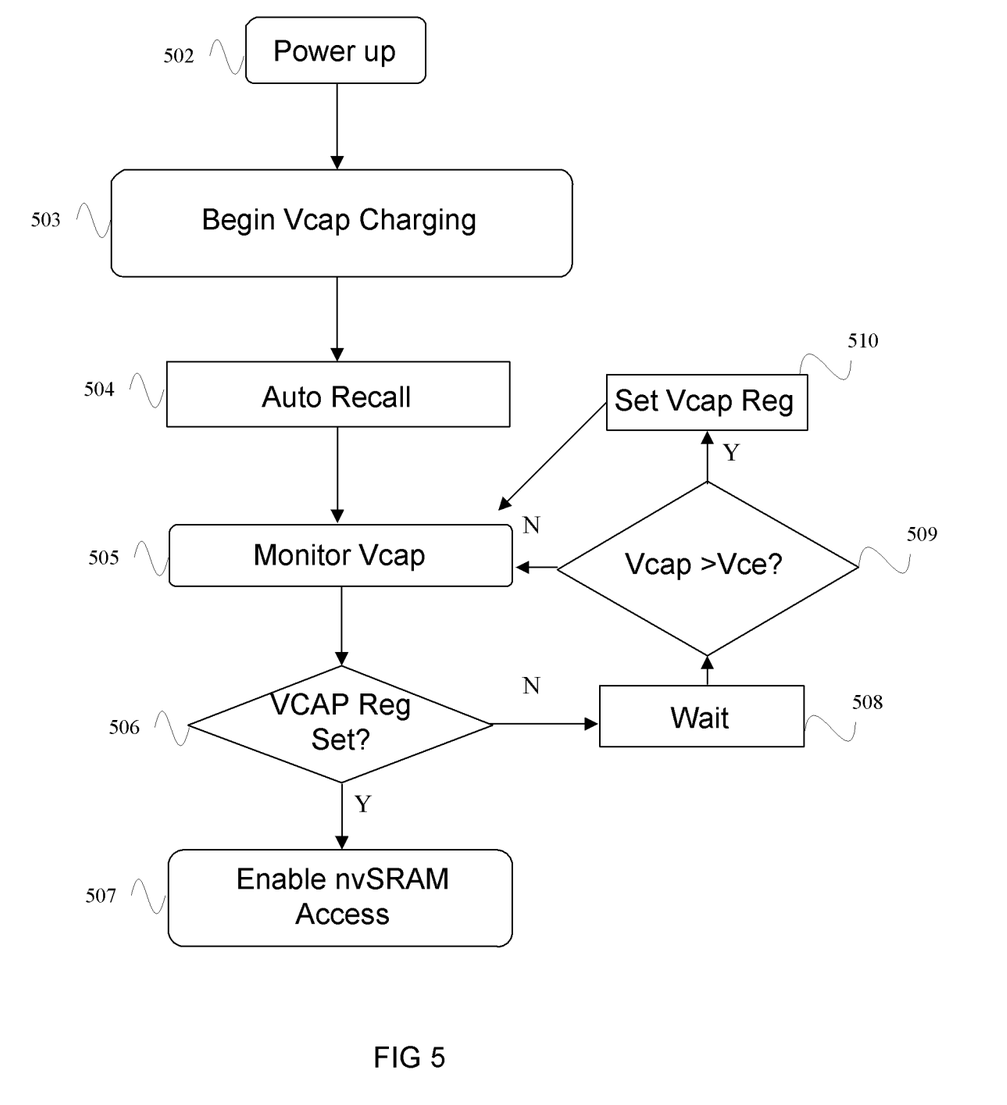
FIG. 5 illustrates a technique for monitoring the charge on a capacitor and delaying an operation until such time as the capacitor is sufficiently charged to complete the operation.

FIG. 5 illustrates a technique for monitoring the charge on VCAP and delaying memory operations (e.g., writes) to a volatile memory until such time as VCAP is sufficiently charged to complete an autostore. VCCX is powered on (502) and charging of VCAP commences (503). An automatic RECALL is performed at power up (504). The Vcap voltage is monitored (505) and the VCAP register is checked (506). If the VCAP register is set, indicating VCAP has sufficient energy to perform an autostore, operations on the nvSRAM are enabled (507). Otherwise, after waiting a short interval (508), Vcap is compared to an upper necessary threshold voltage Vce (509) for powering a complete autostore operation. If Vcap exceeds Vce, the VCAP register is set (510), indicating that memory operations may be performed on the nvSRAM.

Figure 6:
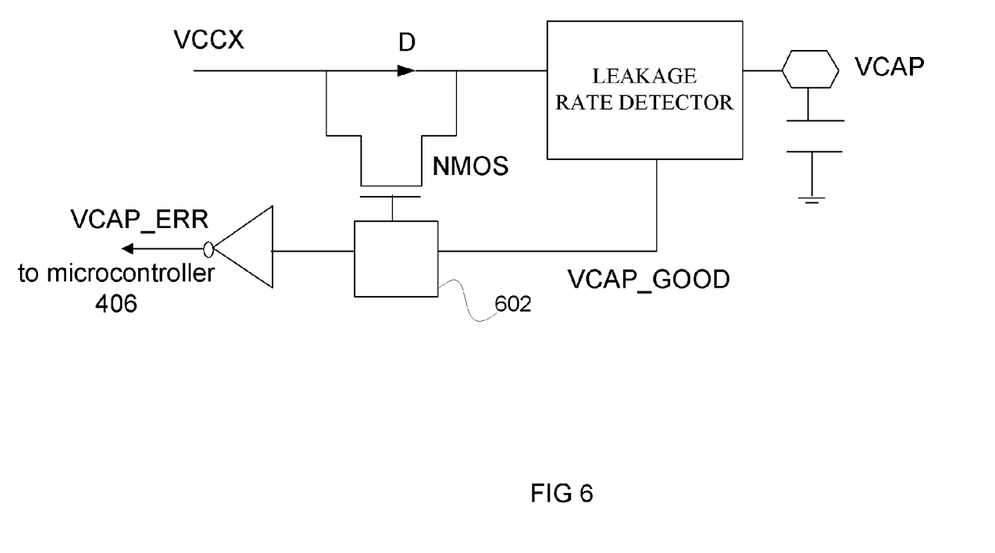
FIG. 6 illustrates a circuit and technique for charging a capacitor through a leakage detection circuit.

FIG. 6 illustrates a circuit and technique for charging VCAP. VCAP is charged through a leakage detection circuit (see FIG. 7, element 703). If the charge leakage rate is below a predetermined threshold, then a signal VCAP_GOOD is asserted that activates the charging transistor NMOS. VCAP_GOOD remains asserted while VCAP continues to charge, and after VCAP is fully charged. VCAP_GOOD will also activate the circuit 602 to boost the voltage on the gate of charging transistor NMOS.

An error signal VCAP_ERR may be generated if the leakage measurement indicates that there is too much leakage of charge from the capacitor. This error signal will inhibit an autostore operation if VCCX falls below Vsws.

Figure 12:
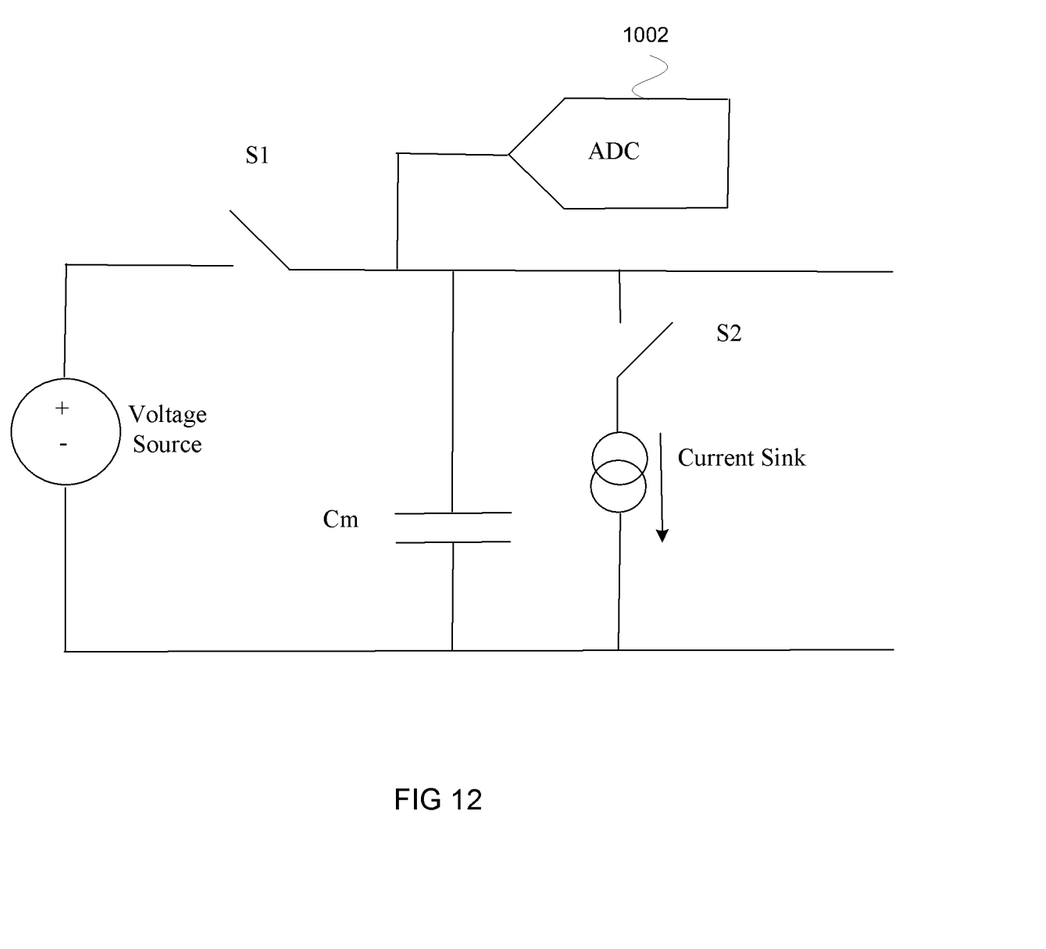
FIG. 12 illustrates an example capacitance measuring circuit.

Another technique for ensuring sufficient energy delivery capability of the backup capacitor for an autostore is to perform a measurement of the capacitance of the capacitor. An example capacitance measuring circuit is illustrated in FIG. 12. During normal (non-measurement) operation, switch S1 is closed and switch S2 is open. During a measurement, S1 is opened and the voltage on the capacitor Cm is measured using the ADC 1002. S2 is then closed for a predetermined time. The voltage on the capacitor Cm is measured a second time using the ADC 1002. The capacitance may then be determined from the difference between the voltage measurements and the time interval between the measurements. Based on the measured capacitance, a necessary charge voltage for the capacitor in order to achieve the necessary energy delivery capability may be determined according to the following relationship:

$$E = \tfrac{1}{2} C V \text{cap}^2$$

Access to the volatile memory may be inhibited until this necessary charge voltage is reached.

Figure 13:
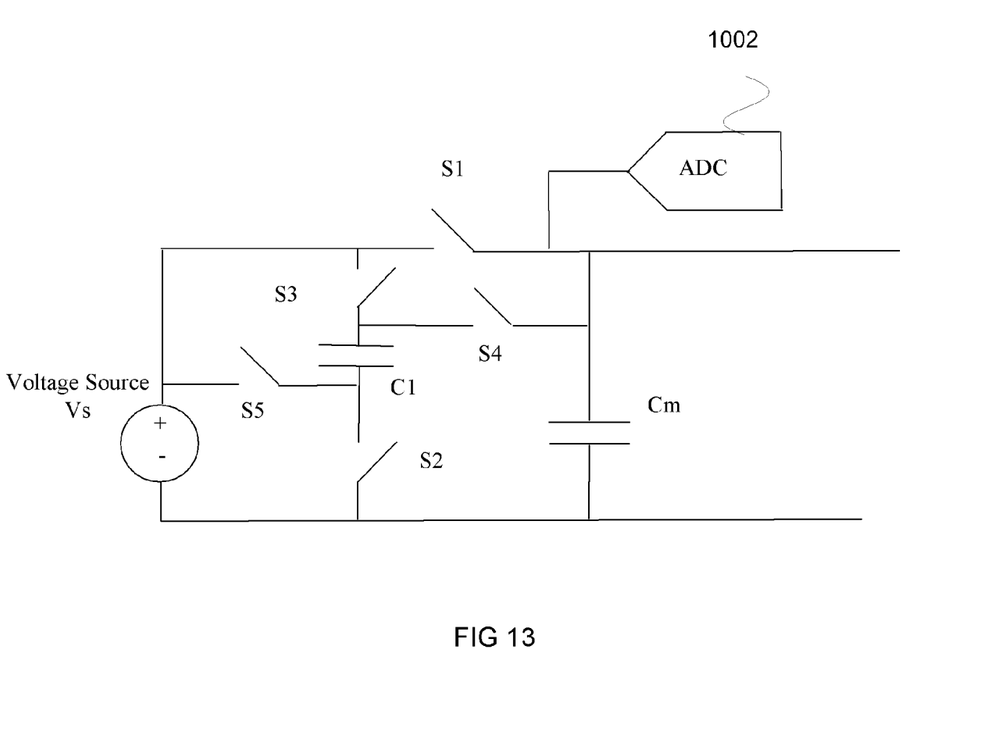
FIG. 13 illustrates and example circuit to measure capacitance using a charge pump to raise or lower the capacitor voltage by a predetermined amount in a predetermined period.

Another technique to measure the capacitance of the capacitor involves using a charge pump to raise or lower Vcap by a predetermined amount in a predetermined period, and determining the capacitance from those measurements. An example circuit for implementing this technique is illustrated in FIG. 13. During normal (non-measurement) operation, switches S1-S3 are closed, and switches S4 and S5 are open. During a measurement operation, S1 is opened and the voltage on capacitor Cm is measured using the ADC 1002. S2 and S3 are opened, S4 and S5 are closed, and C1 discharges into Cm. S4 and S5 are opened, S2 and S3 are closed, and C1 charges. This process is repeated a number of times N. The number N may vary according to the desired precision, system noise or leakage, performance requirements, and other considerations. The voltage on Cm is measured again using the ADC 1002. The capacitance of Cm may then be determined from the known capacitance C1, the value of N, and the voltage Vs.

Figure 7:
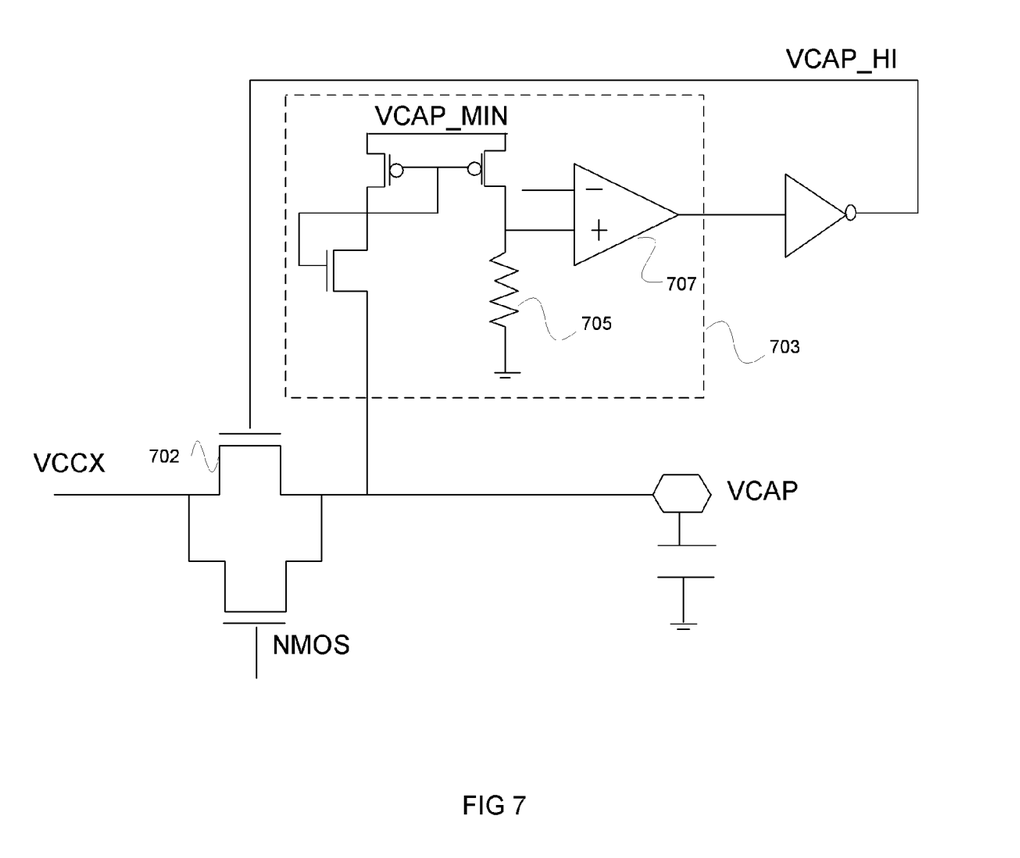
FIG. 7 through 9 illustrate a technique and circuit for determining if the capacitor has sufficient stored energy.
Figure 8:
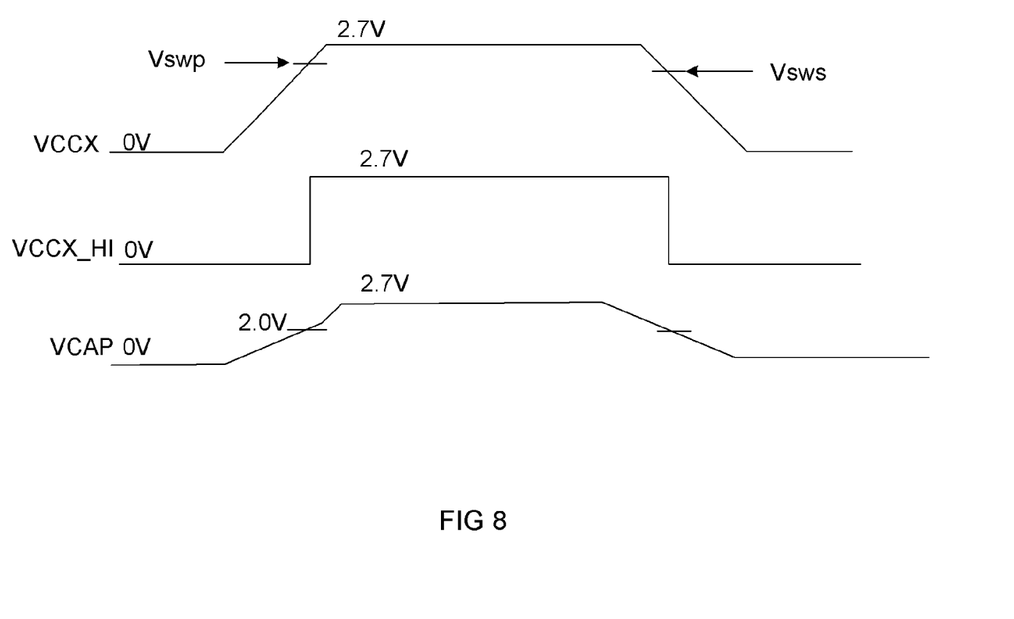
Figure 9:
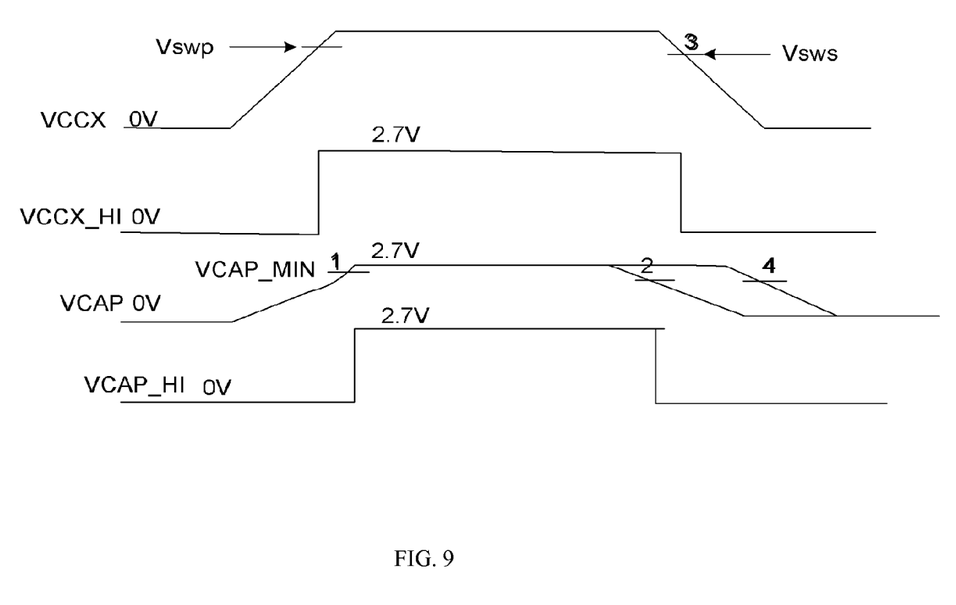
Figure 11:
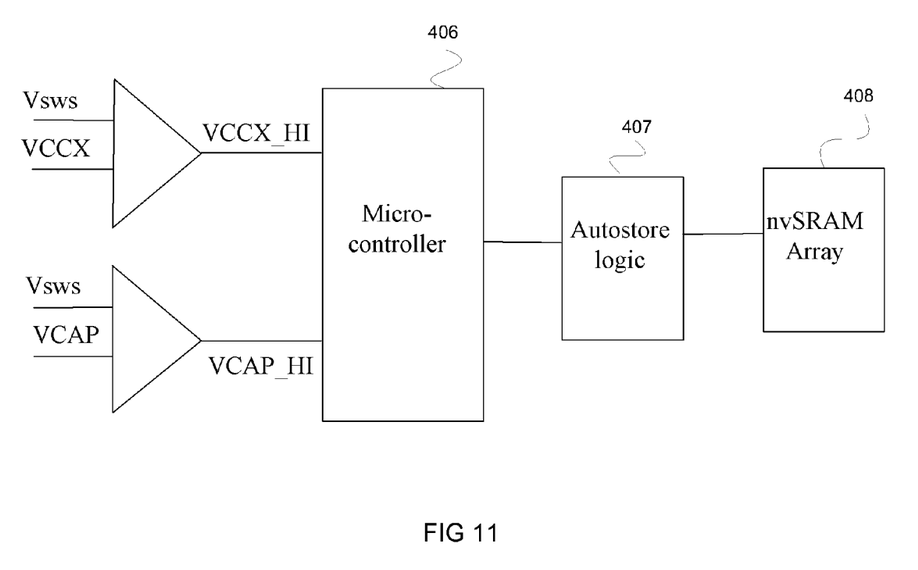
FIG. 11 illustrates an exemplary circuit for measuring the time interval between two predetermined capacitor voltage values under loaded conditions.

The backup power capacitor may be charged after power-on with sufficient energy to perform an autostore. However, due to leakage, tampering, or other unforeseen events, at the time that VCCX falls below Vsws, there may be insufficient stored energy in the capacitor to complete the autostore. FIGS. 7 through 9 illustrate this situation and a technique and circuit for determining if the capacitor has sufficient stored energy, based upon the value of Vcap, which must be higher than a level VCAP_MIN. A detector 703 detects the level of Vcap and asserts a signal VCAP_HI which is indicative of a Vcap level that is sufficient for performing an autostore. When there is leakage on VCAP, the leakage current is mirrored across resistor 705, developing a higher voltage across it and causing the comparator 707 to trip. This signal may be used in conjunction with the techniques described above which measure the time interval between two predetermined Vcap values under loaded conditions. If at any time prior to VCCX falling below Vsws, Vcap falls below a certain value, VCAP_HI goes low, and autostore is inhibited (e.g., via shunt switch 702). If Vcap falls below the predetermined level VCAP_MIN after VCCX falls below Vsws, then VCAP_HI remains asserted and autostore may proceed. FIG. 11 illustrates an exemplary circuit for implementing this feature. If VCAP_HI transitions low before VCCX_HI, autostore is inhibited. If VCCX_HI goes low before VCAP_HI, autostore is not inhibited.

Referring to FIG. 9, Vcap exceeds VCAP_MIN at 1. VCAP_HI is asserted, indicating sufficient charge on VCAP for an autostore. While VCCX is still above Vsws, Vcap dips below VCAP_MIN at 2, and VCAP_HI is de-asserted. This inhibits autostore from taking place after Vccx dips below Vsws at 3. If Vcap dips below VCAP_MIN after Vccx dips below Vsws (3 before 4), autostore is not inhibited.

Figure 10:
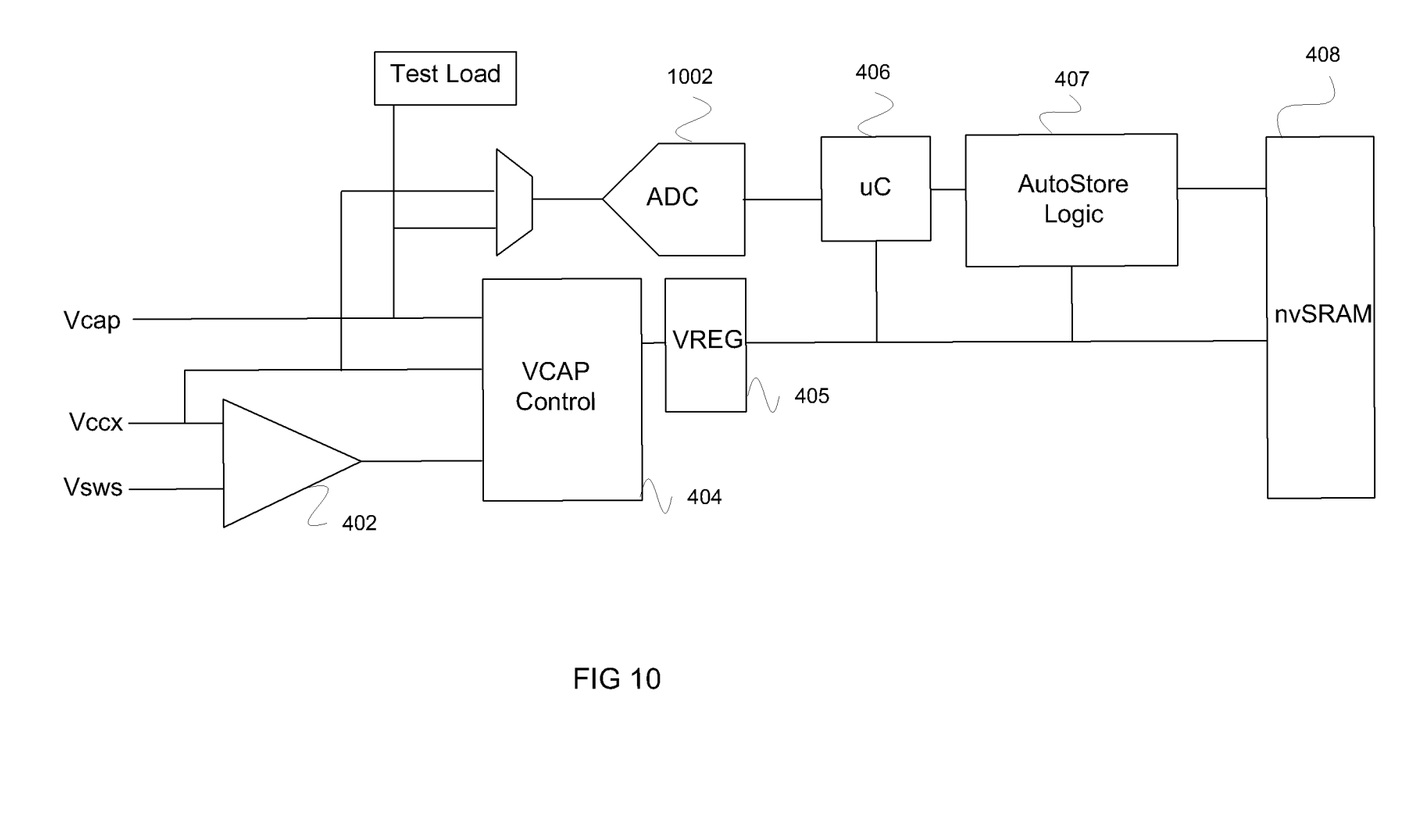
FIG. 10 illustrates logic employing an analog to digital converter (ADC) to measure capacitor voltages and/or a rate of change of the voltage.

It's possible that VCCX could brown out or be shut down while the time interval test is being performed on VCAP. One technique for dealing with this situation is to cancel the time interval test underway in the event Vccx falls by a particular amount (dV), but before Vccx dips below Vsws. Another condition for cancelling the time interval test is if Vccx falls at a rate dV/dT that is faster than a predetermined maximum rate of change, (dV/dT)max. FIG. 10 illustrates logic employing an analog to digital converter (ADC) to measure Vccx and/or dV/dT, and to cancel or proceed with the time interval test on the capacitor accordingly. The memory controller uC may be coupled to the ADC, which may be used to continuously monitor Vccx during the capacitance measurement, and cancel the measurement if dV/dT exceeds (dV/dT)max. In another implementation, the ADC, together with a multiplexor, may be used to replace comparator 403 in the implementation illustrated in FIG. 4. In most embodiments it will be undesirable to replace comparator 402 with an ADC, due to the fast response time required when detecting whether Vccx has fallen below Vsws. In one implementation, the capacitance measurement may be cancelled if Vccx falls by a predetermined amount dV from a previous measurement, rather than waiting for Vccx to fall below Vsws.

In another implementation, the capacitance of VCAP is measured periodically, using for example one of the techniques described above. The measured capacitance may be averaged over several measurements. A median filter may be used to discard outlying measurements. Alternatively, if a significant change in capacitance is measured, the measurement may be immediately (within a short time less than the period interval) repeated to validate the result. The capacitance may change suddenly and substantially, for example, due to a sudden change in ambient temperature.

IMPLEMENTATIONS AND ALTERNATIVES

The techniques and procedures described herein may be implemented via logic distributed in one or more computing devices. The particular distribution and choice of logic is a decision that will vary according to implementation.

Those having skill in the art will appreciate that there are various logic implementations by which processes and/or systems described herein can be effected (e.g., hardware, software, and/or firmware), and that the preferred vehicle will vary with the context in which the processes are deployed. "Software" refers to logic that may be readily readapted to different purposes (e.g. read/write volatile or nonvolatile memory or media). "Firmware" refers to logic embodied as read-only memories and/or media. Hardware refers to logic embodied as analog and/or digital circuits. If an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that implementationing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory.

In a general sense, those skilled in the art will recognize that the various aspects described herein which can be implemented, individually and/or collectively, by a wide range of hardware, software, firmware, or any combination thereof can be viewed as being composed of various types of "circuitry." Consequently, as used herein "circuitry" includes, but is not limited to, electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), circuitry forming a memory device (e.g., forms of random access memory), and/or circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A verification circuit for a capacitor power supply, comprising:
    (a) logic to measure at least two voltages across the terminals of the capacitor at two points in time, the two points in time defining a time interval dT;
    (b) logic to determine a change in voltage dV over the time interval dT, the change in voltage defined by the two voltages that are measured; and
    (c) logic to determine whether to initiate an operation powered by the capacitor, by deriving a total required time or a total required voltage for completing the operation from the time interval dT and/or the voltage change dV, and comparing the total required time or total required voltage to a pre-determined necessary total time or pre-determined necessary total voltage, respectively, for completing the operation;
  wherein the acts performed in (a)-(c) are collectively a "time interval test".

2. The verification circuit of claim 1, further comprising:
    the logic to measure the two voltages across the capacitor terminals comprising a comparator to compare an instantaneous capacitor voltage with a first input and a second input at the two points in time defining dT, the first input to the comparator preset to the first voltage and the second input to the capacitor preset to the second voltage.

3. The verification circuit of claim 1, further comprising:
    the logic to measure the two voltages across the capacitor terminals comprising an analog to digital converter (ADC) and a test load configured to be selectively applied to the capacitor terminals.

4. The verification circuit of claim 1, further comprising:
    logic to assert a signal indicating that the operation may be successfully completed only if it is determined that the total required time or total required voltage are sufficient to perform the operation.

5. The verification circuit of claim 1, further comprising:
    logic to measure a voltage across the capacitor terminals prior to initiating the operation; and
    logic to assert a signal indicating that the operation may be successfully completed, the signal asserted only if the voltage across the capacitor terminals meets or exceeds a minimum voltage.

6. The verification circuit of claim 5, further comprising:
    the minimum voltage is a pre-determined voltage necessary to complete the operation and to carry out the time interval test.

7. The verification circuit of claim 1, further comprising:
    logic to measure a charge leakage from the capacitor terminals prior to initiating the operation; and
    logic to assert a signal indicating that the operation may be successfully completed only if the charge leakage across the capacitor terminals meets or is below a maximum rate.

8. A method for verifying a capacitor power supply, comprising:
    (a) measuring at least two voltages across the terminals of the capacitor at two points in time, the two points in time defining a time interval dT;
    (b) determining a change in voltage dV over the time interval dT, the change in voltage defined by the two voltages that are measured; and
    (c) determining whether to initiate an operation powered by the capacitor, by deriving a total required time or a total required voltage for completing the operation from the time interval dT or the voltage change dV respectively, and comparing the total required time or total required voltage to a pre-determined necessary total time or predetermined necessary total voltage, respectively, for completing the operation;

wherein the acts performed in (a)-(c) are collectively a "time interval test".

9. The method of claim 8, further comprising:
measuring the two voltages across the capacitor terminals using a comparator to compare an instantaneous capacitor voltage with a first input and a second input at the two points in time defining dT, the first input to the comparator preset to the first voltage and the second input to the capacitor preset to the second voltage.

10. The method of claim 8, further comprising:
measuring the two voltages across the capacitor terminals using an analog to digital converter (ADC) and a test load configured to be selectively applied to the capacitor terminals.

11. The method of claim 8, further comprising:
asserting a signal indicating that the operation may be successfully completed only if it is determined that the total required time or total required voltage are sufficient to perform the operation.

12. The method claim 8, further comprising:
measuring a voltage across the capacitor terminals prior to initiating the operation; and
asserting a signal indicating that the operation may be successfully completed only if the voltage across the capacitor terminals meets or exceeds a minimum voltage.

13. The method of claim 12, further comprising:
the minimum voltage is a pre-determined voltage necessary to complete the operation and to carry out the time interval test.

14. The method of claim 8, further comprising:
measuring a charge leakage from the capacitor terminals prior to initiating the operation; and
asserting a signal indicating that the operation may be successfully completed only if the charge leakage across the capacitor terminals meets or is below a maximum rate.

15. An memory system including a primary power supply and a backup capacitor power supply, comprising:
a controller;
an nvSRAM; and
(a) logic to measure at least two voltages across the terminals of the capacitor at two points in time, the two points in time defining a time interval dT;
(b) logic to determine a change in voltage dV over the time interval dT, the change in voltage defined by the two voltages that are measured; and
(c) logic to determine whether to initiate an autostore operation on the nvSRAM, the autostore operation powered by the capacitor, the determination to initiate the autostore operation made by deriving a total required time or a total required voltage for completing the autostore operation from the time interval dT or the voltage change dV, respectively, and comparing the total required time or total required voltage to a pre-determined necessary total time or predetermined necessary total voltage, respectively, for completing the autostore operation;

wherein the acts performed in (a)-(c) are collectively a "time interval test".

16. The memory system of claim 15, further comprising:
the logic to measure the two voltages across the capacitor terminals comprising a comparator to compare an instantaneous capacitor voltage with a first input and a second input at the two points in time defining dT, the first input to the comparator preset to the first voltage and the second input to the capacitor preset to the second voltage.

17. The memory system of claim 15, further comprising:
the logic to measure the two voltages across the capacitor terminals comprising an analog to digital converter (ADC) and a test load configured to be selectively applied to the capacitor terminals.

18. The memory system of claim 15, further comprising:
logic to assert a signal indicating that the autostore operation may be successfully completed only if it is determined that the total required time or total required voltage are sufficient to perform the autostore operation.

19. The memory system of claim 15, further comprising:
logic to measure a voltage across the capacitor terminals prior to initiating the autostore operation; and
logic to assert a signal indicating that the autostore operation may be successfully completed only if the voltage across the capacitor terminals meets or exceeds a minimum voltage.

20. The memory system of claim 19, further comprising:
the minimum voltage is a pre-determined voltage necessary to complete the autostore operation and to carry out the time interval test.

21. The memory system of claim 15, further comprising:
logic to measure a charge leakage from the capacitor terminals prior to initiating the autostore operation; and
logic to assert a signal indicating that the autostore operation may be successfully completed only if the charge leakage across the capacitor terminals meets or is below a maximum rate.

* * * * *